United States Patent
Mishima et al.

[11] Patent Number: 6,115,432
[45] Date of Patent: Sep. 5, 2000

[54] HIGH-FREQUENCY SIGNAL RECEIVING APPARATUS

[75] Inventors: Akira Mishima, Gifu; Hiroaki Ozeki, Osaka, both of Japan

[73] Assignee: Matsushita Electric Industrial Co., Ltd., Osaka, Japan

[21] Appl. No.: 08/981,341

[22] PCT Filed: Apr. 17, 1997

[86] PCT No.: PCT/JP97/01343

§ 371 Date: Dec. 19, 1997

§ 102(e) Date: Dec. 19, 1997

[87] PCT Pub. No.: WO97/40585

PCT Pub. Date: Oct. 30, 1997

[30] Foreign Application Priority Data

Apr. 19, 1996 [JP] Japan ................................. 8-098222

[51] Int. Cl.[7] .......................... H03D 3/24; H04L 27/22
[52] U.S. Cl. .................... 375/326; 375/327; 375/329; 329/307
[58] Field of Search ................... 375/326, 329, 375/327, 344, 345, 319, 316, 376; 329/307, 308

[56] References Cited

U.S. PATENT DOCUMENTS

| | | | |
|---|---|---|---|
| 5,170,392 | 12/1992 | Riordan | 375/345 |
| 5,325,401 | 6/1994 | Halik et al. | 375/329 |
| 5,528,633 | 6/1996 | Halik et al. | 375/327 |
| 5,612,975 | 3/1997 | Becker et al. | 375/319 |
| 5,621,483 | 4/1997 | Krishnamurthy et al. | 329/304 |
| 5,638,140 | 6/1997 | Krishnamurthy et al. | 375/326 |
| 5,710,525 | 1/1998 | Tanaka et al. | 375/376 |
| 5,748,046 | 5/1998 | Badger | 375/376 |
| 5,838,741 | 11/1998 | Callaway, Jr. et al. | 375/376 |

FOREIGN PATENT DOCUMENTS

| | | |
|---|---|---|
| 63-252014 | 10/1988 | Japan . |
| 2-39628 | 2/1990 | Japan . |
| 5-46551 | 2/1993 | Japan . |
| 5-227052 | 9/1993 | Japan . |
| 5-315896 | 11/1993 | Japan . |
| 6-310941 | 11/1994 | Japan . |

OTHER PUBLICATIONS

William Stallings, Data and Computer Communications, Fifth Edition, pp. 171—173.
Japanese language search report for Int'l Appln No. PCT/JP97/01343 dated Jul. 23, 1997.
English translation of Form PCT/ISA/210.

*Primary Examiner*—Stephen Chin
*Assistant Examiner*—Betsy L. Deppe
*Attorney, Agent, or Firm*—Ratner & Prestia

[57] ABSTRACT

A high frequency signal receiving apparatus comprises a microcomputer, coupled to a control terminal of PLL circuit, interface circuit of demodulating section and to a control terminal of decoding section. The microcomputer has input/output terminals coupled to external equipment. The microcomputer controls any one of the PLL circuit, demodulating section and decoding section, based on a signal from the external equipment. With the above described constitution, the burden of external equipment may be alleviated.

18 Claims, 4 Drawing Sheets

FIG. 4
PRIOR ART ific to the demodulating section 8. Decoding section 9 needs to be provided with specific information for error correction represented by, for example, Reed-Solomon, Viterbi decode, etc. through decoding section control terminal 14.

HIGH-FREQUENCY SIGNAL RECEIVING APPARATUS

This Application is a U.S. National Phase Application of PCT International Application PCT/JP97/01343.

TECHNICAL FIELD

The present invention relates to a high frequency signal receiving apparatus for use as digital transmission apparatus.

BACKGROUND ART

A prior art high frequency signal receiving apparatus is described in the following with reference to drawing. A prior art high frequency signal receiving apparatus shown in FIG. 4 comprises an input terminal 1 for receiving digital modulated high frequency signal, a high frequency amplifier 2 coupled to the input terminal 1 a mixer 4 one input of which being coupled to output of the high frequency amplifier 2 while other input being coupled to output of a local oscillator 3, an I/Q detector 6 one input of which being coupled to output of the mixer 4 while other input being coupled to output of a local oscillator 5, an A/D converter 7 coupled to output of the I/Q detector 6, a demodulator 8a which being part of a digital signal demodulating section 8 and coupled to output of the A/D converter 7, a frequency error detector 8b provided within the demodulating section 8, a D/A converter 8d provided between the frequency error detector 8b and said local oscillator 5, a digital signal decoding section 9 coupled to output of said demodulator 8, an output terminal 10 coupled to output of the decoding section 9, a PLL circuit 11 coupled to said local oscillator 3, a PLL circuit control terminal 12 coupled to control input of the PLL (phase locked loop) circuit 11, a demodulating section control terminal 13 coupled to an interface circuit 8e which circuit being control input of said demodulating section 8, and a decoding section control terminal 14 coupled to control input of said decoding section 9.

Figure 4:
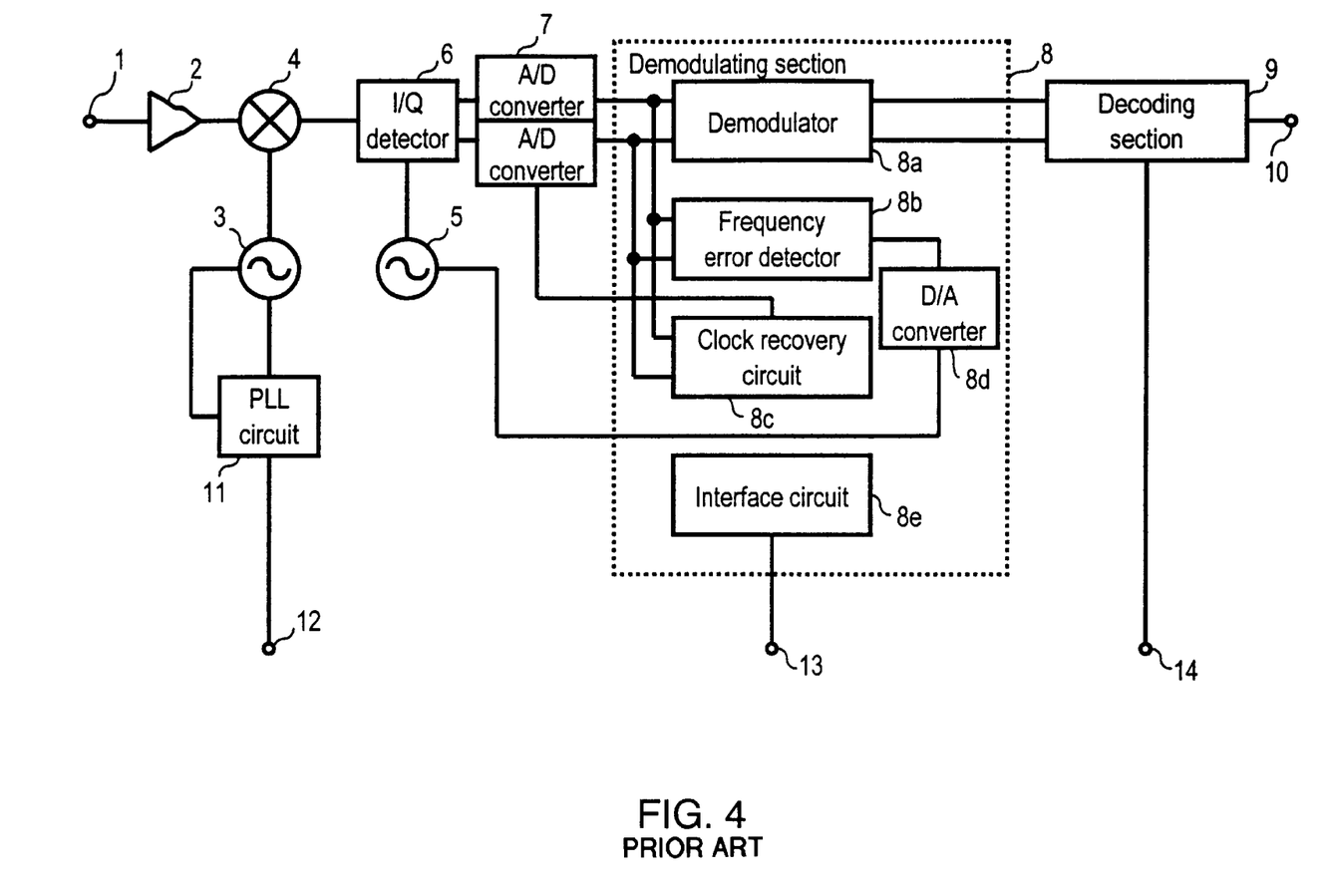
FIG. 4 is a block diagram of a prior art high frequency signal receiving apparatus.

The operation of the above high frequency signal receiving apparatus is described in the following. A digital modulated high frequency signal inputted to input terminal 1 is amplified at high frequency amplifier 2, mixed at the mixer 4 with an output frequency from the local oscillator 3, and a desired high frequency signal is tuned. This is converted at A/D converter 7 into digital value after quadrature detection by I/Q detector 6, and delivered to demodulator 8a. In the demodulator 8a, digital signal is demodulated. An oscillation frequency of around 479.5 MHz for the I/Q detection is obtained at local oscillator 5 by inputting the output of frequency error detector 8b to the local oscillator 5 after D/A conversion at D/A converter 8d. Thus the demodulating section 8 reduces the frequency error by the feedback, also reproduces clock in a clock recovery circuit 8c. The digital demodulation is performed accurately using the reproduced clock. Output of the demodulator 8a is delivered to output terminal 10 after undergoing error correction, etc. at decoding section 9.

In the above described conventional structure, however, the PLL circuit control terminal 12, demodulating section control terminal 13 and decoding section control terminal 14 are connected respectively direct to outside or external equipments. For example, the PLL circuit control terminal 12 of PLL circuit 11 receives signal for tuning clock signal, data signal, enable signal, etc. direct from outside equipment. The PLL circuit 11 need to be provided with a one which is different depending on destination market. Demodulating section 8 needs to be provided with roll-off factor, data for specifying difference of tuner specification, frequency dividing rate, transmission rate, etc. through the demodulating section control terminal 13 in a format specific to the demodulating section 8. Decoding section 9 needs to be provided with specific information for error correction represented by, for example, Reed-Solomon, Viterbi decode, etc. through decoding section control terminal 14.

As described above, the prior art constitution requires specific control for each of the terminals, such a control in an outside equipment is quite complicated, which may lead to a delayed processing in the main function of the outside equipment, posing a heavy burden on the outside equipment.

DISCLOSURE OF THE INVENTION

To address the problem, the present invention presents a high frequency signal receiving apparatus with which the burden of the outside equipment is alleviated.

The invented high frequency signal receiving apparatus comprises a microcomputer, one group of input/output terminals of which being coupled to control terminal of PLL circuit, control terminal of demodulating section and control terminal of decoding section, while other group of input/output terminals to outside equipment; which microcomputer is controlled based on an oscillation frequency generated from a fixed oscillation element, at the same time, the microcomputer controls, based on a signal delivered from outside equipment inputted through the other group of input/output terminals, at least any one among the PLL circuit, the demodulating section and the decoding section.

With the above described constitution, the burden of the outside equipment may be alleviated.

BEST MODE FOR CARRYING OUT THE INVENTION

A high frequency signal receiving apparatus in accordance with the present invention comprises an input terminal for receiving digital modulated high frequency signal, a mixer one input of which being supplied with the signal inputted in the input terminal while other input being coupled to output of a local oscillator, a digital signal demodulating section to which the output of mixer being supplied, a digital signal decoding section to which the output of demodulating section being supplied, an output terminal coupled to the output of the decoding section, a PLL circuit coupled to said local oscillator, and a microcomputer, one group of input/output terminals of which being coupled to control terminal of said PLL circuit, control terminal of said demodulating section and control terminal of said decoding section, while other group of input/output terminals to outside equipment. The microcomputer is controlled based on an oscillation frequency generated from a fixed oscillation element, at the same time, the microcomputer controls, based on a signal delivered from outside equipment inputted through said other group of input/output terminals, at least any one among said PLL circuit, said demodulating section and said decoding section. As the apparatus is provided with a microcomputer having one group of input/output terminals which is coupled to control terminal of PLL circuit, control terminal of demodulating section and control terminal of decoding section, while other group of input/output terminals coupled to outside equipment, the outside equipment may simply issue a command to the microcomputer, and then the microcomputer controls said PLL circuit, said demodulating section, said decoding section based on the command delivered from the outside equipment. Therefore, the burden of outside equipment is significantly alleviated. The control line from outside equipment may be connected only with a microcomputer, which means a simplified connection work and an eliminated interference among control lines. Furthermore, designing of the outside equipment may turn out to be easy.

A high frequency signal receiving apparatus in accordance with a first embodiment of the present invention uses a frequency of fixed oscillation element outputted from microcomputer as the reference oscillation frequency of PLL circuit. Thus a fixed oscillation element is shared in common by the microcomputer and the PLL circuit, which may contribute to making a high frequency signal receiving apparatus smaller and less expensive.

A high frequency signal receiving apparatus in accordance with another embodiment of the present invention comprises a microcomputer, within whose ROM 51 a plurality of types of instruction information for at least any one of PLL circuit, demodulating section and decoding section are stored. Any desired information among the plurality of types of instruction information may be selected freely from the outside. So, one microcomputer may be used for different applications each having its own specification, for example, for reception of CATV broadcast, reception of BS broadcast, etc. This helps reduce the cost of microcomputer through volume production.

A high frequency signal receiving apparatus in accordance with still another embodiment of the present invention uses at least mixer and local oscillator shielded from the other circuits. As the mixer and the local oscillator, both being the high frequency circuits, are shielded from the other circuits, there is least possibility of picking up digital noise. Also, there is least possibility for the local oscillator to affect outside equipment with the leaking oscillation frequency.

A high frequency signal receiving apparatus in accordance with yet another embodiment of the present invention comprises a mixer, a local oscillator and a PLL circuit are housed in a first metal case, while a demodulating section, a decoding section and a microcomputer are housed in a second metal case. Each of the first and the second cases forming an entity of independent function, therefore each of these may be sold or controlled separately. Furthermore, as the size of each case is smaller as compared with a single integrated case the freedom in mounting on a mother substrate may increase.

A high frequency signal receiving apparatus in accordance with a further embodiment of the present invention comprises an outside equipment and a microcomputer communicate to each other confirming the exchange of signal after every one unit of information. As the microcomputer performs its operation confirming the exchange of signal with an outside equipment, an error-free control may be expected. Also, it is possible for an outside equipment to take an appropriate countermeasure when some failure is detected with the high frequency receiving apparatus.

A high frequency signal receiving apparatus in accordance with still another embodiment of the present invention comprises a first control line connecting a microcomputer with a PLL circuit is a connection line that is different from a second connection line connecting said microcomputer to a demodulating section or a decoding section. As the PLL circuit is separated from the demodulating section or the decoding section, the mutual interference may not take place, and a control signal for controlling the demodulating section or the decoding section may not be mixed into the PLL circuit, so no increase of phase noise of local oscillator.

A high frequency signal receiving apparatus also comprises an I/Q detector provided between a mixer and a demodulating section, containing a second local oscillator. The second local oscillator is controlled by an error signal outputted from a frequency error detecting circuit provided within said demodulating section, and the microcomputer controls the demodulating section so as the output pulse counts of the second local oscillator reaches a certain predetermined number within a certain predetermined time span. As the oscillation frequency of second local oscillator is under surveilance of microcomputer, the accuracy is equal to that of a fixed oscillation element of the microcomputer. Therefore, with respect to drift by humidity in the second local oscillating section, the second local oscillator does not need to employ an expensive item such as dielectric resonator. This helps implement an inexpensive high frequency signal receiving apparatus.

Figure 1:
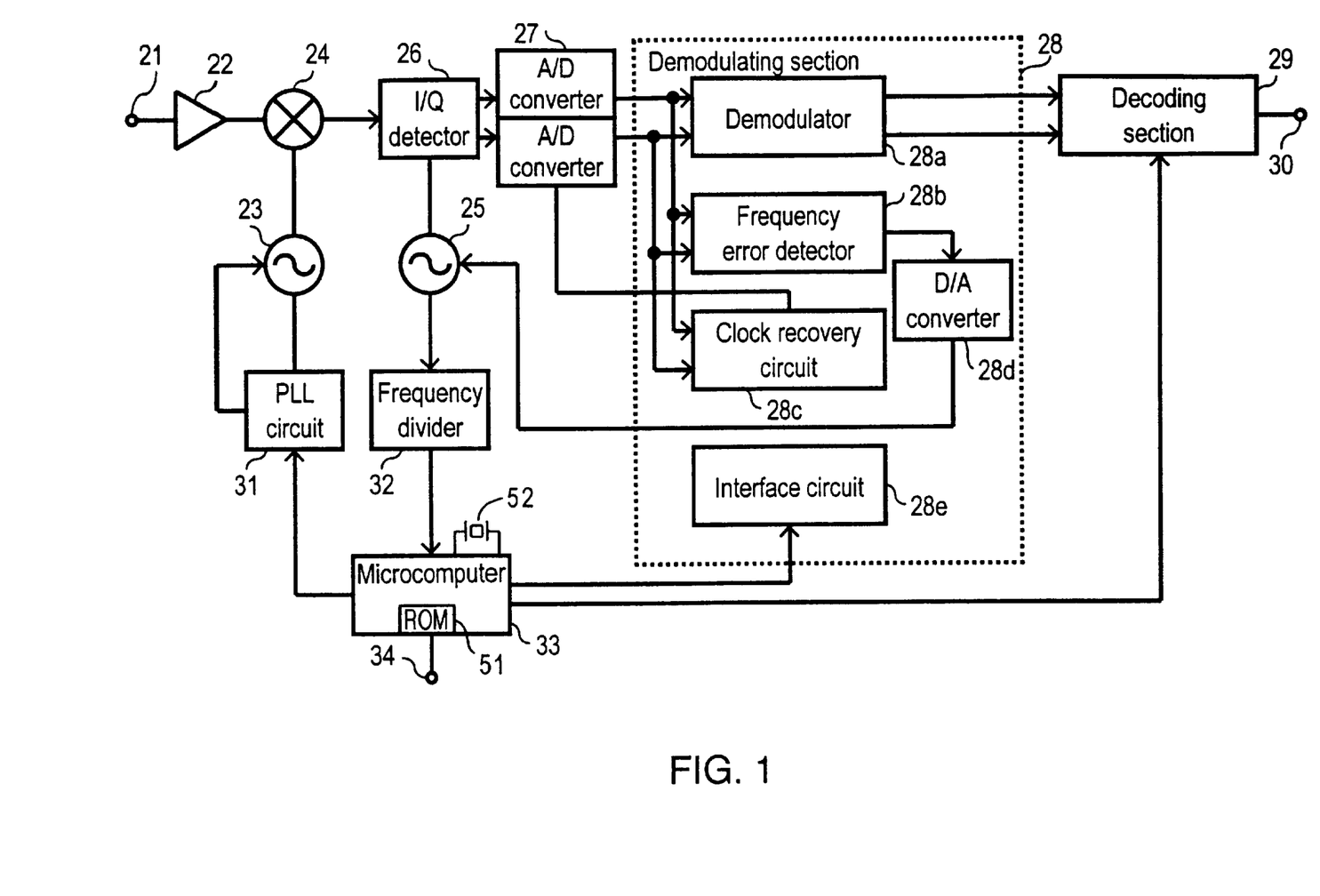
FIG. 1 is a block diagram of a high frequency signal receiving apparatus in accordance with an exemplary embodiment of the present invention.

Now in the following, an embodiment according to the present invention is described referring to drawings. An invented high frequency signal receiving apparatus comprises, as shown in FIG. 1, an input terminal 21 for receiving digital modulated high frequency signal, a high frequency amplifier 22 coupled to the input terminal 21, a mixer 24 one input of which being coupled to output of the high frequency amplifier 22 while other input being coupled to output of a local oscillator 23, an I/Q detector 26 one input of which being coupled to output of the mixer 24 while other input being coupled to output of a local oscillator 25, an A/D converter 27 coupled to output of the I/Q detector 26, a digital signal demodulating section 28 coupled to the output of A/D converter 27, a demodulator 28a and a frequency error detector 28b both provided within the demodulating section 28, a D/A converter 28d provided between the frequency error detector 28b and the input of said local oscillator 25, a digital signal decoding section 29 coupled to output of said demodulating section 28, an output terminal 30 coupled to the output of decoding section 29, a PLL circuit 31 coupled to said local oscillator 23, a frequency divider 32 coupled to output of said local oscillator 25, a microcomputer 33 whose one group of input/output terminals is coupled to all of the following items, control terminal of said PLL circuit 31, the output of said frequency divider 32, an interface circuit 28e which works as the control terminal of demodulating section for controlling said demodulating section 28 and the control terminal of said demodulating section 28; and a control terminal 34 coupled to one of the other group of input/output terminals of the microcomputer 33. Numeral 28c represents a clock recovery circuit in demodulating section 28.

The operation of the above high frequency signal receiving apparatus is described in the following. A digital modulated high frequency signal inputted to input terminal 21 is amplified at high frequency amplifier 22, mixed at the mixer 24 with an output frequency from the local oscillator 23, and a desired high frequency signal is tuned and outputted. This is converted at A/D converter 27 into digital value after quadrature detection by I/Q detector 26, and delivered to demodulator 28a of demodulating section 28. In the demodulator 28a, digital signal is demodulated. Local oscillator 25 yields an oscillation frequency of around 479.5 MHz which is the center frequency of IF signal for I/Q detection by inputting the output of frequency error detector 28b to the local oscillator 25 after DIA conversion at D/A converter 28d.

The IF signal is described in detail hereunder. A signal from a low noise converter is delivered to input terminal 21 of high frequency signal receiving apparatus. When a high frequency signal transmitted from a broadcasting station passes through the low noise converter a small frequency error sometimes arises. Then the center frequency of IF signal may not be exactly at 479.5 MHz. So, the output of local oscillator 25 is watched in a reverse way via frequency divider 32, and microcomputer 33 controls the local oscillator 25 so as it generates an output frequency of 479.5 MHz+a, making the output of frequency error detector 28b to be "0". The frequency shift at low noise converter is thus absorbed. In demodulating section 28, clock is reproduced at the clock recovery circuit 28c. The digital demodulation is performed precisely using the clock thus reproduced. Output of the demodulating section 28 undergoes error correction, etc. at decoding section 29, and is delivered as output through the output terminal 30.

A control signal from an outside equipment is delivered through control terminal 34 to microcomputer 33. The microcomputer 33 reads the contents of control signal, and outputs control signal towards control terminal of PLL circuit 31, interface circuit 28e of demodulating section 28 and control terminal of decoding section 29 in order to control PLL circuit 31, demodulating section 28, decoding section 29 respectively. What is requested to the outside equipment is to deliver a control signal only to the microcomputer 33, which means a substantially reduced burden at the outside equipment. Further, control lines from the outside equipment are connected only to microcomputer 33, which means a simplified connection as well as a less mutual interference among the control lines.

As described above, outside equipment is not requested to conduct different specific controls respectively, therefore the control in outside equipment may be simplified significantly, and burden in the outside equipment is alleviated; which results in an increased processing speed in the outside equipment. At the same time, designing of an outside equipment becomes easy with the high frequency signal receiving apparatus.

The microcomputer 33 employs a quartz oscillator 52 as the fixed oscillation element to obtain precise clock frequency. The microcomputer 33 which having a precise clock frequency watches the oscillation frequency of local oscillator 25 through frequency divider 32. The frequency drift of local oscillator 25 against temperature and humidity is equal to that of the quartz oscillator 52. Therefore, a precise oscillation frequency may be assured against the humidity drift, without using an expensive dielectric resonator.

Figure 2:
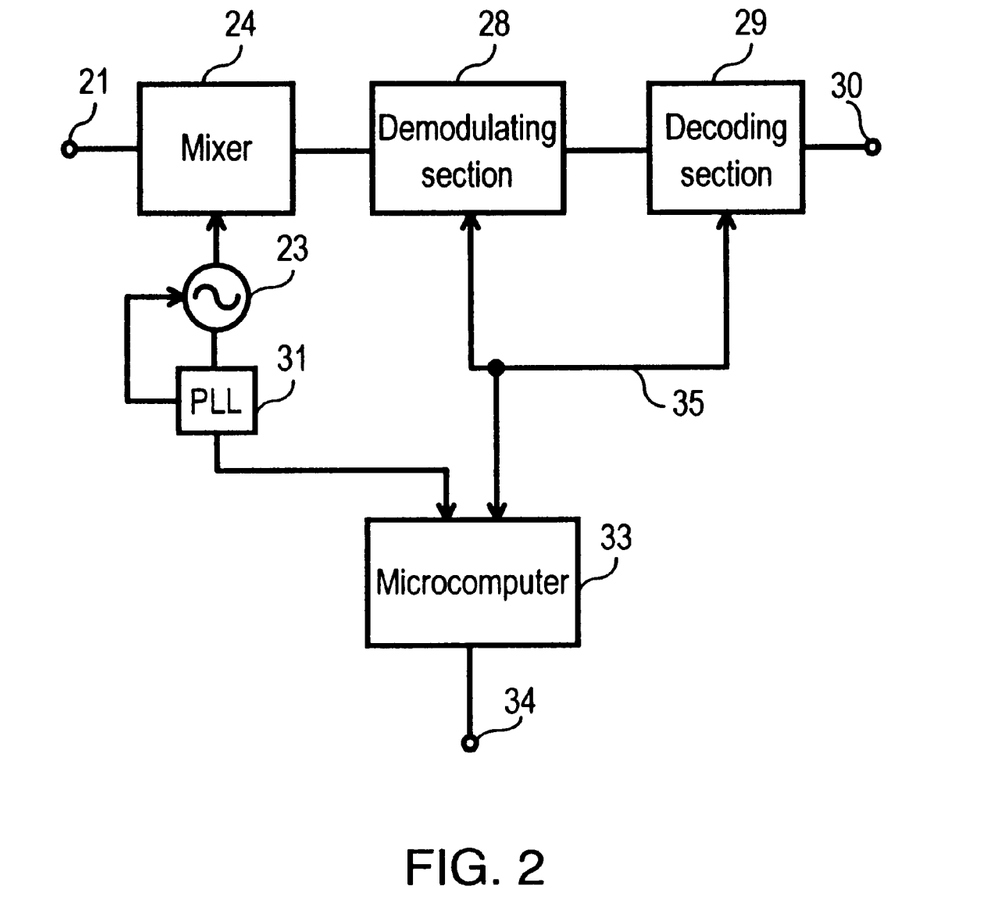
FIG. 2 is a block diagram used for explaining the structure of bus line of FIG. 1.

Although a common control line(bus line) 35 may be used for coupling the microcomputer 33 to demodulating section 28 or decoding section 29, as shown in FIG. 2, it is preferred to use an independent control line for the control terminal of PLL circuit 31. This comes from a consideration to avoid the possibility of a digital signal which is irrelevant to the PLL circuit 31 coming into PLL circuit 31 or local oscillator 23, resulting in a deteriorated phase noise of local oscillator 23. (Table 1) shows that different modulation system or the error correction method is used depending on the type of broadcasting, CATV or BS, etc.

TABLE 1

|  | CATV broadcast | BS broadcast |
| --- | --- | --- |
| Modulation system | VSB. 64QAM 256QAM (needs switching) | QPSK (no switching) |
| Error correction | Reed-Solomon | Reed-Solomon Viterbi Decode |

Even when the demodulating section 28 and decoding section 29 change due to different specification, the microcomputer 33 works consistently to either specifications responding to signal from outside. The switching may be conducted by either providing a specific input terminal in the microcomputer 33 and fixing the signal level of which terminal, or providing an instruction from the control terminal 34. By the above described way, a volume produced microcomputer 33 of a single model can meet various different specifications. The cost reduction may be expected through volume production of the microcomputer 33.

Figure 3:
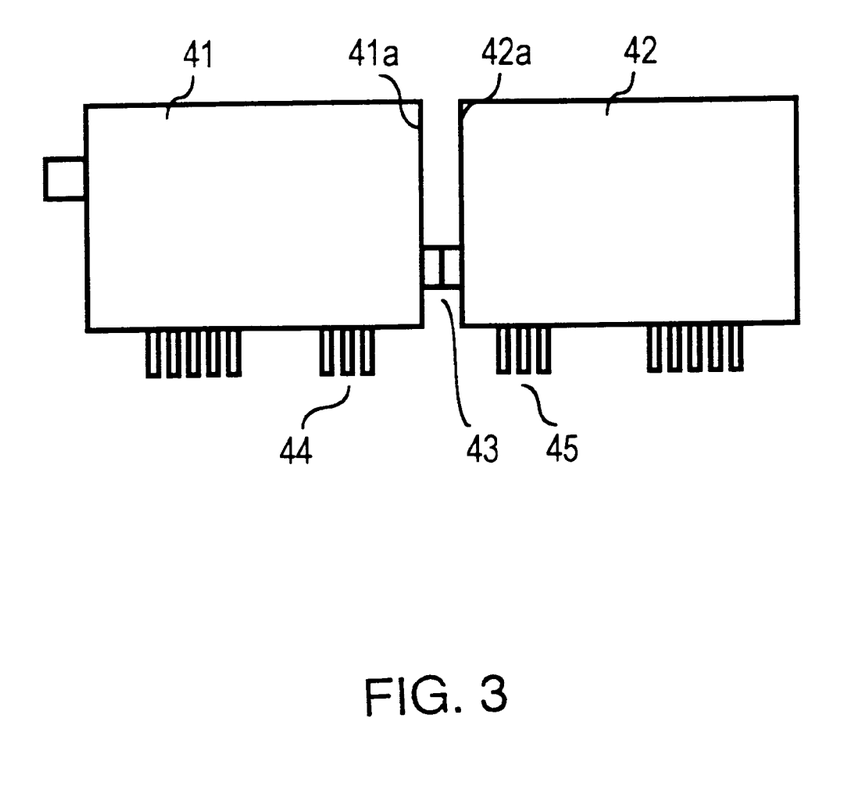
FIG. 3 shows a side view of the high frequency signal receiving apparatus of FIG. 1.

An invented high frequency signal receiving apparatus as shown in FIG. 3 is divided into two units, each having an approximately rectangular shape and is made of metal. In a first unit 41, high frequency amplifier 22, local oscillator 23, mixer 24, PLL circuit 31, I/Q detector 26, second local oscillator 25 and frequency divider 32 are mounted; while in a second unit 42, A/D converter 27, demodulating section 28, decoding section 29 and microcomputer 33 are mounted.

The first unit 41 is a portion of a high frequency circuit corresponding to so-called tuner, while the second unit 42 contains demodulating section 28 and decoding section 29; all being digital circuits. Thus the first unit 41, or tuner, is shielded by a metal case, which means the tuner is least affected by mixing of unnecessary signal from outside, and hardly generate unnecessary electric wave to outside. Further, as each of the units has a specific function independent to each other, respective units may be manufactured, sold or controlled separately. The two units 41, 42 are connectable and detachable in the sides 41a, 42a, or may be coupled using a connector 43. Those units having no connector 43 may be coupled by inserting terminal 44 of first unit 41 and terminal 45 of second unit 42 in a mother printed circuit board.

Communication between a high frequency signal receiving apparatus and an outside equipment is performed in the following manner. For transferring a command to a high frequency signal receiving apparatus, a start signal and then an address of the high frequency signal receiving apparatus are transmitted from outside equipment. Command word is transmitted upon receiving an affirmative response signal of the high frequency signal receiving apparatus. The command word comprises type of words and detailed content thereof. In any case, command words are sent one unit by one unit after receiving an affirmative response from the other party.

For surveying the state of a high frequency signal receiving apparatus, a start signal and then an address of the high frequency signal receiving apparatus are transmitted from outside equipment. After an affirmative response signal of the high frequency signal receiving apparatus, content of register is transmitted showing a state of the high frequency signal receiving apparatus. Following an affirmative response from the outside equipment, the high frequency signal receiving apparatus transmits a parity signal. Because it proceeds to a next step only after receiving an affirmative response, the communication is performed in a sure and dependable way. When affirmative response is not available, the transmission is repeated automatically up to three times. In case no affirmative response is obtained, or there is no response after the automatic repetition of transmission, the transmittance is terminated after a certain predetermined time lapsed. Then, a new communication procedure has to be started, or an operator is notified for taking other different means. When communicating with an outside equipment, the clock of microcomputer 33 needs to be precise enough for synchronization with the outside equipment. In the present embodiment, a quartz oscillator is used.

Some of the major command words are described in the following. In the case of channel selection, a channel frequency is transmitted following a command of channel selection. Then the microcomputer 33 sets PLL circuit 31's main counter value and swallow counter value so as to be able to receive the channel frequency.

For setting a demodulation condition, a detailed content formed with three bytes is transmitted following a command of condition setting. The first byte specifies a roll-off factor and a codifying rate, the second byte a frequency dividing rate and a designation of tuner specification, the third byte a designation of transmitting rate. Other commands include reading out of a register which indicates the state of a high frequency signal receiving apparatus, reading out of an error register, etc. As described in the above, as the command system is unified, the high frequency signal receiving apparatus may be controlled easily by anybody.

INDUSTRIAL APPLICABILITY

The invented high frequency signal receiving apparatus comprises a microcomputer, one group of input/output terminals of which being coupled to control terminal of PLL circuit, control terminal of demodulating section and control terminal of decoding section, while other group of input/output terminals to outside equipment; which microcomputer is controlled based on an oscillation frequency generated from a fixed oscillation element, and at the same time, controls, based on a signal delivered from outside equipment inputted through said other group of input/ output terminals, at least any one among said PLL circuit, said demodulating section and said decoding section. As the apparatus is provided with a microcomputer, one group of whose input/output terminals being coupled to control terminal of PLL circuit, control terminal of demodulating section and control terminal of decoding section, while other group of input/output terminals to outside equipment, the outside equipment may simply issue an order to the microcomputer. Then, the microcomputer controls said PLL circuit, said demodulating section, said decoding section based on an instruction delivered from the outside equipment. Therefore, the burden of outside equipment is significantly alleviated.

The control line from outside equipment is connected only with a microcomputer, which means a simplified connection work and an eliminated mutual interference among control lines.

Furthermore, designing of the outside equipment may become easier.

Explanation of the Notations in the Drawings

1 Input terminal
2 High frequency amplifier
3 Local oscillator
4 Mixer
5 Local oscillator
6 I/Q detector
7 A/D converter
8 Demodulating section
8a Demodulator
8b Frequency error detector
8c Clock recovery circuit
8d D/A converter
8e Interface circuit
9 Decoding section
10 Output terminal
11 PLL circuit
12 PLL circuit control terminal
13 Demodulating section control terminal
14 Decoding section control terminal
21 Input terminal
22 High frequency amplifier
23 Local oscillator
24 Mixer
25 Local oscillator
26 I/Q detector
27 A/D converter
28 Demodulating section
28a Demodulator
28b Frequency error detector
28c Clock recovery circuit
28d D/A converter
28e Interface circuit
29 Decoding section
30 Output terminal
31 PLL circuit
32 Frequency divider
33 Microcomputer
34 Control terminal
35 Control line(bus line)
41 First unit
41a Side
42 Second unit
42a Side
43 Connector
44 Terminal
45 Terminal

What is claimed is:

1. A high frequency signal receiving apparatus comprising:

an input terminal for receiving a digital modulated high frequency signal, a mixer having one input supplied with the signal inputted to the input terminal and another input is coupled to an output of a first local oscillator, a demodulating section to which an output of said mixer is supplied, a second local oscillator coupled to the output of said mixer;

a decoding section coupled to an output of said demodulating section, an output terminal coupled to an output of said decoding section, a PLL circuit coupled to said first local oscillator, and a microcomputer having a first group of input/output terminals coupled to i) a control terminal of said PLL circuit, ii) a control terminal of said demodulating section, iii) an output of said second local oscillator and iv) a control terminal of said decoding section, and a second group of input/output terminals coupled to outside equipment; wherein the microcomputer i) is controlled by a first oscillation frequency generated by a fixed oscillation element and ii) controls at least one of said PLL circuit, said demodulating section and said decoding section based on i) a signal delivered from said outside equipment input through said second group of input/output terminals and ii) the output of said second local oscillator.

2. The high frequency signal receiving apparatus recited in claim 1, wherein said first oscillation frequency of said fixed oscillation element output from said microcomputer is used as a reference oscillation frequency of said PLL circuit.

3. The high frequency signal receiving apparatus recited in claim 1, wherein said microcomputer includes a ROM, and said microprocessor stores in said ROM a plurality of types of specifying information for at least any one of i) said PLL circuit, ii) said demodulating section and iii) said decoding section, said specifying information being externally selectable.

4. The high frequency signal receiving apparatus recited in claim 1, wherein at least said mixer and said first local oscillator are shielded from other circuits.

5. The high frequency signal receiving apparatus recited in claim 4, wherein i) said mixer, said first and second local oscillators and said PLL circuit are housed in a first metal case, and ii) said demodulating section, said decoding section and said microcomputer are housed in a second metal case.

6. The high frequency signal receiving apparatus recited in claim 1, wherein said outside equipment and said microcomputer communicate each other by confirming the exchange of information after every one unit of information.

7. A high frequency signal receiving apparatus comprising:

an input terminal for receiving digital modulated high frequency signal, a mixer having one input supplied with the signal inputted to the input terminal while another input is coupled to an output of a first local oscillator, a demodulating section to which an output of said mixer is supplied, a second local oscillator coupled to the output of said mixer;

a decoding section coupled to an output of said demodulating section, an output terminal coupled to an output of said decoding section, a PLL circuit coupled to said first local oscillator, and a microcomputer having a first group of input/output terminals coupled to i) a control terminal of said PLL circuit, ii) a control terminal of said demodulating section, iii) an output of said second local oscillator and iv) a control terminal of said decoding section, and a second group of input/output terminals coupled to outside equipment; wherein the microcomputer i) is controlled by an oscillation frequency generated by a fixed oscillation element and ii) controls said PLL circuit, said demodulating section and said decoding section based on a signal delivered from said outside equipment inputted through said second group of input/output terminals and the output of said second local oscillator, and a first control line connecting said microcomputer with said PLL circuit is a first connection line that is different from a second connection line connecting said microcomputer to at least one of said demodulating section and said decoding section.

8. The high frequency signal receiving apparatus recited in claim 7, wherein said oscillation frequency of said fixed oscillation element outputted from said microcomputer is used as a reference oscillation frequency of said PLL circuit.

9. The high frequency signal receiving apparatus recited in claim 7, wherein said microcomputer includes a ROM, and said microprocessor stores in said ROM a plurality of types of specifying information for at least any one of i) said PLL circuit, ii) said demodulating section and iii) said decoding section, said specifying information being externally selectable.

10. The high frequency signal receiving apparatus recited in claim 7, wherein at least said mixer and said first local oscillator are shielded from other circuits.

11. The high frequency signal receiving apparatus recited in claim 10, wherein i) said mixer, said first local oscillator and said PLL circuit are housed in a first metal case, and ii) said demodulating section, said decoding section and said microcomputer are housed in a second metal case.

12. The high frequency signal receiving apparatus recited in claim 7, wherein said outside equipment and said microcomputer communicate each other by confirming the exchange of information after every one unit of information.

13. A high frequency signal receiving apparatus comprising:

an input terminal for receiving a digital modulated high frequency signal, a mixer having one input supplied with the signal inputted to the input terminal while another input is coupled to an output of a first local oscillator, a demodulating section to which an output of said mixer is supplied, a decoding section coupled to an output of said demodulating section, an output terminal coupled to an output of said decoding section, a PLL circuit coupled to said first local oscillator, an I/Q detector including a second local oscillator provided between said mixer and said demodulating section, and a microcomputer having a first group of input/output terminals coupled to i) a control terminal of said PLL circuit, ii) a control terminal of said demodulating section, iii) an output of said second local oscillator and iv) a control terminal of said decoding section, and a second group of input/output terminals coupled to outside equipment; wherein the microcomputer i) is controlled by an oscillation frequency generated by a fixed oscillation element and ii) controls said PLL circuit, said demodulating section and said decoding section based on a signal delivered from said outside equipment inputted through said second group of input/output terminals and the output of said second local oscillator, wherein the second local oscillator is controlled by an error signal output from a frequency error detector of said demodulating section, and the microcomputer controls the demodulating section so that an output pulse count of the second local oscillator reaches a predetermined number within a predetermined time.

14. The high frequency signal receiving apparatus recited in claim 13, wherein said oscillation frequency of said fixed oscillation element outputted from said microcomputer is used as a reference oscillation frequency of said PLL circuit.

15. The high frequency signal receiving apparatus recited in claim 13, wherein said microcomputer includes a ROM, and said microprocessor stores in said ROM a plurality of types of specifying information for at least any one of i) said PLL circuit, ii) said demodulating section and iii) said decoding section, said specifying information being externally selectable.

16. The high frequency signal receiving apparatus recited in claim 13, wherein at least said mixer and said first local oscillator are shielded from other circuits.

17. The high frequency signal receiving apparatus recited in claim 16, wherein i) said mixer, said first local oscillator and said PLL circuit are housed in a first metal case, and ii) said demodulating section, said decoding section and said microcomputer are housed in a second metal case.

18. The high frequency signal receiving apparatus recited in claim 13, wherein said outside equipment and said microcomputer communicate each other by confirming the exchange of information after every one unit of information.

* * * * *

UNITED STATES PATENT AND TRADE MARK OFFICE
CERTIFICATE OF CORRECTION

PATENT NO.   : 6,115,432
DATED         : September 5, 2000
INVENTOR(S)  : Mishima et al.

It is certified that error appears in the above-identified patent and that said Letters Patent is hereby corrected as shown below:

Cover page, item [56] References Cited, Other Publications, "William Stallings, Data and Computer Communications, Fifth Edition, pp. 171-173" should read --William Stallings, Data and Computer Communications, Fifth Edition, pp. 171-173, (1997).--

Signed and Sealed this

First Day of May, 2001

Attest:

NICHOLAS P. GODICI

*Attesting Officer*           *Acting Director of the United States Patent and Trademark Office*